(12) United States Patent
Fujimoto et al.

(10) Patent No.: US 12,347,995 B2
(45) Date of Patent: Jul. 1, 2025

(54) CHAMBER DEVICE, GAS LASER DEVICE, AND ELECTRONIC DEVICE MANUFACTURING METHOD

(71) Applicant: Gigaphoton Inc., Tochigi (JP)

(72) Inventors: Junichi Fujimoto, Oyama (JP); Rei Takenaka, Oyama (JP); Masanori Teramoto, Oyama (JP); Jeffrey P. Sercel, Manchester, NH (US)

(73) Assignee: Gigaphoton Inc., Tochigi (JP)

( * ) Notice: Subject to any disclaimer, the term of this patent is extended or adjusted under 35 U.S.C. 154(b) by 181 days.

(21) Appl. No.: 18/447,510

(22) Filed: Aug. 10, 2023

(65) Prior Publication Data

US 2023/0387642 A1   Nov. 30, 2023

Related U.S. Application Data

(63) Continuation of application No. PCT/JP2022/003119, filed on Jan. 27, 2022.

(Continued)

(51) Int. Cl.
*H01S 3/036* (2006.01)
*G03F 7/00* (2006.01)
*H01S 3/225* (2006.01)

(52) U.S. Cl.
CPC .......... *H01S 3/036* (2013.01); *G03F 7/70025* (2013.01); *G03F 7/70916* (2013.01); *H01S 3/225* (2013.01)

(58) Field of Classification Search
CPC .......... H01S 3/036; H01S 3/038; H01S 3/225; H01S 3/0346; H01S 3/03; H01S 3/0971;

(Continued)

(56) References Cited

U.S. PATENT DOCUMENTS

2005/0025208 A1   2/2005   Bliven et al.
2007/0002918 A1   1/2007   Niemoeller et al.
(Continued)

FOREIGN PATENT DOCUMENTS

DE        20309570 U1 * 10/2003   ............. H01S 3/225
JP        H05226746      *  9/1993
(Continued)

OTHER PUBLICATIONS

English translation of DE20309570, published on Oct. 9, 2003. (Year: 2003).*

(Continued)

*Primary Examiner* — Christina A Riddle
(74) *Attorney, Agent, or Firm* — Studebaker Brackett PLLC

(57) ABSTRACT

A chamber device includes a housing into which a laser gas is filled, a pair of discharge electrodes generating light from the laser gas when a voltage is applied thereto, a window arranged at a wall surface of the housing and transmitting the light therethrough, a first fan causing the laser gas to flow between the discharge electrodes, a filter, a second fan rotating together with the first fan by a drive force of a drive source of the first fan, a fan-side flow path causing the laser gas filtered by the filter to flow by the second fan and a part of the laser gas to flow in a direction away from the window, and a window-side flow path communicating with the fan-side flow path and causing the laser gas flowing from the fan-side flow path by the second fan to flow toward the window.

20 Claims, 4 Drawing Sheets

Related U.S. Application Data

(60) Provisional application No. 63/165,589, filed on Mar. 24, 2021.

(58) Field of Classification Search
CPC .... H01S 3/097; H01S 3/09705; H01S 3/0979; H01S 3/076; H01S 3/104; H01S 3/1055; H01S 3/134; H01S 3/2232; H01S 3/2251; H01S 3/2256; H01S 3/2308; H01S 3/032; H01S 3/0343; H01S 3/0384; H01S 3/0385; H01S 3/0388; H01S 3/041; H01S 3/073; H01S 3/09713; H01S 3/0323; H01S 3/0404; H01S 3/0401; H01S 3/1028; H01S 3/1026; H01S 3/027; H01S 3/10023; H01S 3/1003; H01S 3/1301; H01S 3/13017; H01S 3/13013; H01S 3/1305; H01S 3/1306; H01S 3/131; H01S 3/1317; H01S 3/1315; H01S 3/14; H01S 3/22; G03F 7/70025; G03F 7/70891; G03F 7/70575; G03F 7/20; G03F 7/70008; G03F 7/7005; G03F 7/70041; G03F 7/70483; G03F 7/70491; G03F 7/7055; G03F 7/705; G03F 7/70504; G03F 7/70508; G03F 7/70516; G03F 7/70525; G03F 7/70533; G03F 7/70541; G03F 7/70558; G03F 7/70583; G03F 7/70808; G03F 7/70841; G03F 7/7085; G03F 7/70858; G03F 7/70883; G03F 7/70908; G03F 7/70916; G03F 7/70925; G03F 7/70933; G03F 7/70941; G03F 7/70958; G03F 7/70975; G03F 7/70983; G03F 7/70991; B03C 3/155

USPC ........ 355/18, 30, 52–55, 67–77; 372/55, 56, 372/57, 58, 59, 60, 61, 62, 63, 64, 65, 34, 372/38.1, 38.05, 90, 98, 103, 10

See application file for complete search history.

(56) References Cited

U.S. PATENT DOCUMENTS

| | | |
|---|---|---|
| 2010/0107870 A1 | 5/2010 | Morton et al. |
| 2015/0249312 A1 | 9/2015 | Tsushima et al. |
| 2015/0333468 A1 | 11/2015 | Liu et al. |

FOREIGN PATENT DOCUMENTS

| | | |
|---|---|---|
| JP | H06-132582 A | 5/1994 |
| JP | H06-152030 A | 5/1994 |
| JP | H06-237029 A | 8/1994 |
| JP | H06-275902 A | 9/1994 |
| JP | H07-118556 A | 5/1995 |
| JP | 2002-136046 A | 5/2002 |
| JP | 2007-507858 A | 3/2007 |
| JP | 2015-537386 A | 12/2015 |
| WO | 2014/069636 A1 | 5/2014 |

OTHER PUBLICATIONS

English translation of JP H05-226746, published Sep. 3, 1993 (Year: 1993).*

International Search Report issued in PCT/JP2022/003119; mailed Mar. 29, 2022.

Written Opinion issued in PCT/JP2022/003119; mailed Mar. 29, 2022.

* cited by examiner

CHAMBER DEVICE, GAS LASER DEVICE, AND ELECTRONIC DEVICE MANUFACTURING METHOD

CROSS-REFERENCE TO RELATED APPLICATIONS

The present application claims the benefit of International Application No. PCT/JP2022/003119, filed on Jan. 27, 2022, the entire contents of which are hereby incorporated by reference.

BACKGROUND

1. Technical Field

The present disclosure relates to a chamber device, a gas laser device, and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectrum line width of about 350 pm to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectrum line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectrum line width. In the following, a gas laser device with a narrowed spectrum line width is referred to as a line narrowing gas laser device.

LIST OF DOCUMENTS

Patent Documents

Patent Document 1: Japanese Patent Application Publication No. H6-132582
Patent Document 2: Japanese Patent Application Publication No. H6-152030
Patent Document 3: Japanese Patent Application Publication No. H6-237029
Patent Document 4: Japanese Examined Patent Application Publication No. H7-118556

SUMMARY

A chamber device according to an aspect of the present disclosure includes a housing into which a laser gas is filled; a pair of discharge electrodes arranged to face each other at an internal space of the housing and configured to generate light from the laser gas when a voltage is applied thereto; a window arranged at a wall surface of the housing and configured to transmit the light therethrough; a first fan arranged at the internal space and configured to cause the laser gas to flow between the pair of discharge electrodes; a filter arranged at the internal space; a second fan configured to rotate together with the first fan by a drive force of a drive source of the first fan; a fan-side flow path arranged at the internal space and configured to cause the laser gas filtered by the filter to flow by the second fan and a part of the laser gas to flow in a direction away from the window; and a window-side flow path arranged at the internal space, communicating with the fan-side flow path, and configured to cause the laser gas flowing from the fan-side flow path by the second fan to flow toward the window.

A gas laser device according to an aspect of the present disclosure includes a chamber device. Here, the chamber device includes a housing into which a laser gas is filled; a pair of discharge electrodes arranged to face each other at an internal space of the housing and configured to generate light from the laser gas when a voltage is applied thereto; a window arranged at a wall surface of the housing and configured to transmit the light therethrough; a first fan arranged at the internal space and configured to cause the laser gas to flow between the pair of discharge electrodes; a filter arranged at the internal space; a second fan configured to rotate together with the first fan by a drive force of a drive source of the first fan; a fan-side flow path arranged at the internal space and configured to cause the laser gas filtered by the filter to flow by the second fan and a part of the laser gas to flow in a direction away from the window; and a window-side flow path arranged at the internal space, communicating with the fan-side flow path, and configured to cause the laser gas flowing from the fan-side flow path by the second fan to flow toward the window.

An electronic device manufacturing method according to an aspect of the present disclosure includes generating laser light using a gas laser device including a chamber device, outputting the laser light to an exposure apparatus, and exposing a photosensitive substrate to the laser light in the exposure apparatus to manufacture an electronic device. Here, the chamber device includes a housing into which a laser gas is filled; a pair of discharge electrodes arranged to face each other at an internal space of the housing and configured to generate light from the laser gas when a voltage is applied thereto; a window arranged at a wall surface of the housing and configured to transmit the light therethrough; a first fan arranged at the internal space and configured to cause the laser gas to flow between the pair of discharge electrodes; a filter arranged at the internal space; a second fan configured to rotate together with the first fan by a drive force of a drive source of the first fan; a fan-side flow path arranged at the internal space and configured to cause the laser gas filtered by the filter to flow by the second fan and a part of the laser gas to flow in a direction away from the window; and a window-side flow path arranged at the internal space, communicating with the fan-side flow path, and configured to cause the laser gas flowing from the fan-side flow path by the second fan to flow toward the window.

BRIEF DESCRIPTION OF THE DRAWINGS

Embodiments of the present disclosure will be described below merely as examples with reference to the accompanying drawings.

DESCRIPTION OF EMBODIMENTS

Figure 1:
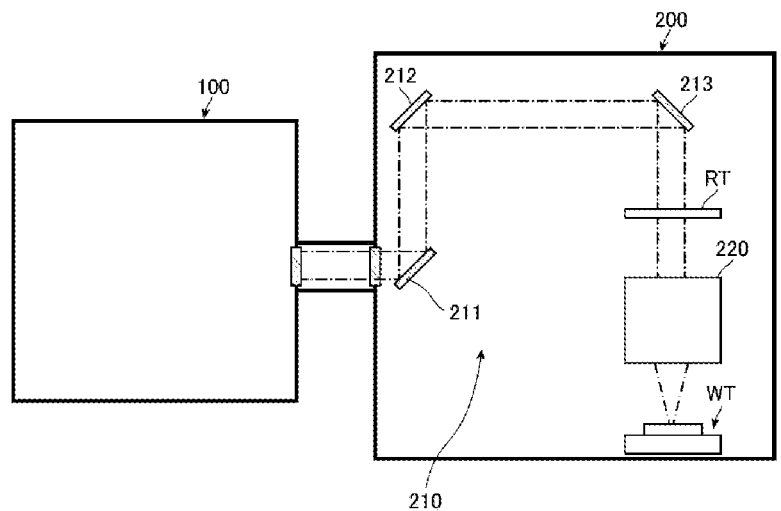
FIG. 1 is a schematic view showing a schematic configuration example of an entire electronic device manufacturing apparatus.

1. Description of electronic device manufacturing apparatus used in exposure process of electronic device
2. Description of gas laser device of comparative example
   2.1 Configuration
   2.2 Operation
   2.3 Problem
3. Description of chamber device of first embodiment
   3.1 Configuration
   3.2 Operation
   3.3 Effect
4. Description of chamber device of second embodiment
   4.1 Configuration
   4.2 Effect Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Description of Electronic Device Manufacturing Apparatus Used in Exposure Process of Electronic Device FIG. 1 is a schematic view showing a schematic configuration example of an entire electronic device manufacturing apparatus used in an exposure process of an electronic device. As shown in FIG. 1, the manufacturing apparatus used in the exposure process includes a gas laser device 100 and an exposure apparatus 200. The exposure apparatus 200 includes an illumination optical system 210 including a plurality of mirrors 211, 212, 213 and a projection optical system 220. The illumination optical system 210 illuminates a reticle pattern of a reticle stage RT with laser light incident from the gas laser device 100. The projection optical system 220 causes the laser light transmitted through the reticle to be imaged as being reduced and projected on a workpiece (not shown) arranged on a workpiece table WT. The workpiece is a photosensitive substrate such as a semiconductor wafer on which photoresist is applied. The exposure apparatus 200 synchronously translates the reticle stage RT and the workpiece table WT to expose the workpiece to the laser light reflecting the reticle pattern. Through the exposure process as described above, a device pattern is transferred onto the semiconductor wafer, thereby a semiconductor device, which is the electronic device, can be manufactured.

2. Description of Gas Laser Device of Comparative Example 2.1 Configuration

The gas laser device 100 of a comparative example will be described. The comparative example of the present disclosure is an example recognized by the applicant as known only by the applicant, and is not a publicly known example admitted by the applicant.

Figure 2:
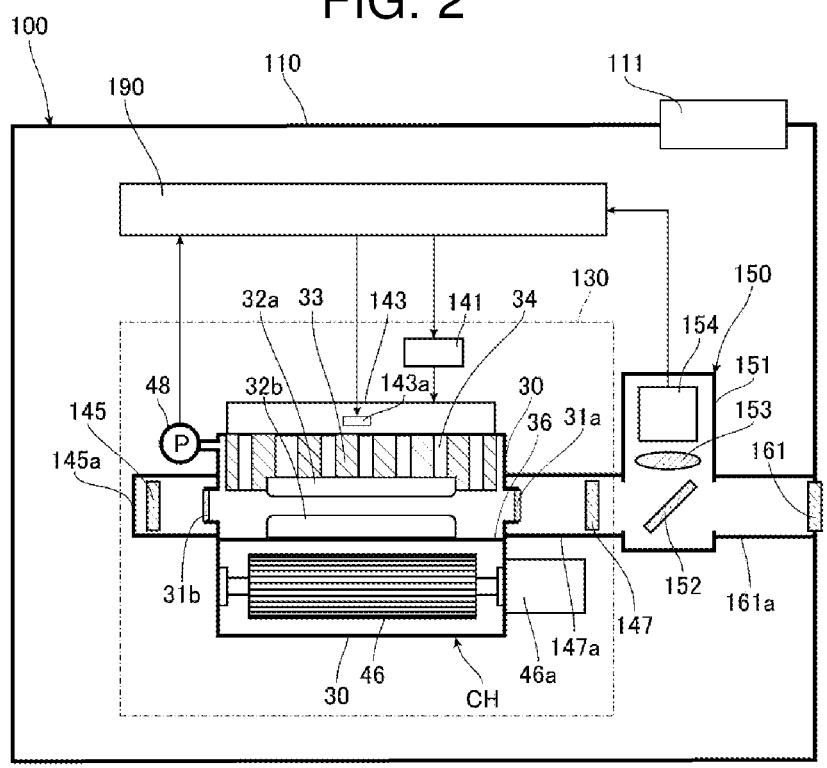
FIG. 2 is a schematic view showing a schematic configuration example of an entire gas laser device of a comparative example.

FIG. 2 is a schematic view showing a schematic configuration example of the entire gas laser device 100 of the present example. The gas laser device 100 is, for example, an ArF excimer laser device using a mixed gas including argon (Ar), fluorine ($F_2$), and neon (Ne). In this case, the gas laser device 100 outputs pulse laser light having a center wavelength of about 193 nm. The gas laser device 100 may be a gas laser device other than the ArF excimer laser device, and may be, for example, a KrF excimer laser device using a mixed gas including krypton (Kr), $F_2$, and Ne. In this case, the gas laser device 100 outputs pulse laser light having a center wavelength of about 248 nm. The mixed gas containing Ar, $F_2$, and Ne which is a laser medium and the mixed gas containing Kr, $F_2$, and Ne which is a laser medium may be referred to as a laser gas. In the mixed gas used in each of the ArF excimer laser device and the KrF excimer laser device, helium (He) may be used instead of Ne.

The gas laser device 100 of the present example includes a housing 110, a laser oscillator 130 arranged at the internal space of the housing 110, a monitor module 150, a laser gas supply device (not shown), a laser gas exhaust device (not shown), and a laser processor 190 as a main configuration.

The laser oscillator 130 includes a chamber device CH, a charger 141, a pulse power module 143, a rear mirror 145, and an output coupling mirror 147 as a main configuration.

Figure 3:
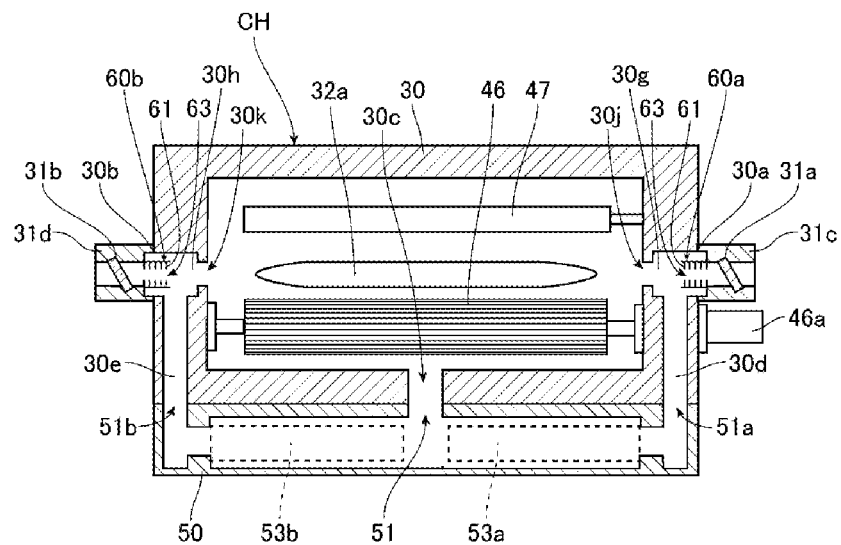
FIG. 3 is a view showing the internal space of a housing of a chamber device shown in FIG. 2 viewed from an insulating portion side toward a cross flow fan side.
Figure 4:
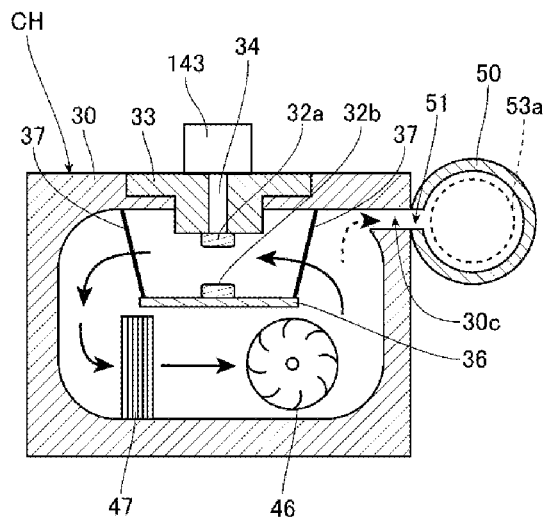
FIG. 4 is a sectional view, perpendicular to the travel direction of laser light, of the chamber device shown in FIG. 2.

In FIG. 2, the internal configuration of the chamber device CH is shown as viewed from a direction substantially perpendicular to the travel direction of the laser light. FIG. 3 is a view showing the internal space of a housing 30 of the chamber device CH viewed from an insulating portion 33 side toward a cross flow fan 46 side. FIG. 4 is a sectional view, perpendicular to the travel direction of the laser light, of the chamber device CH shown in FIG. 2. The chamber device CH includes the housing 30, a pair of windows 31a, 31b, a pair of electrodes 32a, 32b, the insulating portion 33, a feedthrough 34, an electrode holder portion 36, the cross flow fan 46, a heat exchanger 47, a pressure sensor 48, and a filter case 50 as a main configuration.

The housing 30 is filled with the laser gas described above. Further, the housing 30 includes an internal space in which light is generated by excitation of the laser gas. The laser gas is supplied from the laser gas supply device to the internal space of the housing 30 through a pipe (not shown). The light generated by the excitation of the laser gas travels to the windows 31a, 31b.

The window 31a is located on the front side in the travel direction of the laser light from the gas laser device 100 to the exposure apparatus 200, and the window 31b is located on the rear side in the travel direction. The windows 31a, 31b are inclined at the Brewster angle with respect to the travel direction of the laser light so that P-polarized light of the laser light is suppressed from being reflected. The window 31a is arranged at a front-side wall surface of the housing 30, and the window 31b is arranged at a rear-side wall surface of the housing 30. Specifically, as shown in FIG. 3, the window 31a is held by a cylindrical holder 31c connected to the front-side wall surface, and is arranged to face the opening 30a of the wall surface by the holder 31c. Further, the window 31b is held by a holder 31d connected to the rear-side wall surface having the same configuration as the holder 31c, and is arranged to face the opening 30b of the wall surface by the holder 31d.

The longitudinal direction of the electrodes 32a, 32b is along the travel direction of the laser light, and the electrodes 32a, 32b are arranged to face each other at the internal space of the housing 30. The space between the electrode 32a and the electrode 32b in the housing 30 is sandwiched between the window 31a and the window 31b. The electrodes 32a, 32b are discharge electrodes for exciting the laser medium by glow discharge. In the present example, the electrode 32a is the cathode and the electrode 32b is the anode.

The electrode 32a is supported by the insulating portion 33. The insulating portion 33 blocks an opening continued to the housing 30. The insulating portion 33 includes an insulator. Examples of the insulator include alumina ceramics having low reactivity with an $F_2$ gas. Further, a feedthrough 34 made of a conductive member is arranged in the insulating portion 33. The feedthrough 34 applies a voltage supplied from the pulse power module 143 to the electrode 32a.

The electrode 32b is supported by the electrode holder portion 36 and is electrically connected to the electrode holder portion 36. In FIG. 3, for clarity of illustration, the electrode holder portion 36 is not shown. Further, as shown in FIG. 4, the electrode holder portion 36 is electrically connected to the housing 30 via return plates 37.

The cross flow fan 46 is arranged at the internal space of the housing 30 on the side opposite to the electrode 32b side with respect to the electrode holder portion 36. At the internal space of the housing 30, the space at which the cross flow fan 46 is arranged is in communication with the space between the electrodes 32a, 32b. The cross flow fan 46 is connected to a motor 46a arranged outside the housing 30. When the motor 46a rotates, the cross flow fan 46 rotates. By the rotation of the cross flow fan 46, the laser gas flows through the space between the electrodes 32a, 32b. In FIG. 4, the flow of the laser gas is indicated by thick arrows. The laser gas circulates, by the cross flow fan 46, through the cross flow fan 46, the space between the electrode 32a and the electrode 32b, the heat exchanger 47, and the cross flow fan 46 in this order. ON/OFF and the number of revolution of the motor 46a are adjusted by the control of the laser processor 190. Accordingly, the laser processor 190 can adjust the circulation speed of the laser gas circulating through the internal space of the housing 30 by controlling the motor 46a.

The heat exchanger 47 is arranged beside the cross flow fan 46. Most of the laser gas flowing due to the cross flow fan 46 passes through the heat exchanger 47, and the heat of the laser gas is removed by the heat exchanger 47.

As shown in FIGS. 3 and 4, a filter case 50 is arranged on the wall surface of the housing 30 on the side opposite to the heat exchanger 47 with respect to the cross flow fan 46. The filter case 50 includes an inlet port 51 that communicates with an opening 30c that is continuous to substantially the center of the housing 30 in the travel direction of the laser light, and outlet ports 51a, 51b that communicate with flow paths 30d, 30e provided in the wall surfaces of the housing 30 on the front side and the rear side, respectively. Further, at the internal space of the filter case 50, a front-side filter 53a is arranged between the inlet port 51 and the outlet port 51a on the front side, and a rear-side filter 53b is arranged between the inlet port 51 and the outlet port 51b on the rear side. The filter 53a and the filter 53b are indicated by broken lines in FIG. 3, have the same shape and length as each other, and filter the laser gas passing therethrough to remove fine particles described later from the laser gas.

The flow path 30d communicates with a front-side purge chamber 30g provided in the front-side wall surface of the housing 30, and the purge chamber 30g communicates with the internal space of the housing 30 through an opening 30j on the front-side wall surface and communicates with the internal space of the holder 31c through the opening 30a. A purge chamber is also provided in the rear-side wall surface, and the rear-side purge chamber 30h communicates with the flow path 30e, with the internal space of the housing 30 through an opening 30k on the rear-side wall surface, and with the internal space of the holder 31d through the opening similarly to the purge chamber 30g.

A front-side cylindrical member 60a is arranged in the purge chamber 30g. The longitudinal direction of the cylindrical member 60a is along the travel direction of the laser light. One end of the cylindrical member 60a is located away from the opening 30j and closer to the holder 31c than the flow path 30d. The other end of the cylindrical member is connected to the edge of the holder 31c to surround the opening of the holder 31c. Similarly to the purge chamber a rear-side cylindrical member 60b is arranged in the purge chamber 30h.

The cylindrical member 60a includes a plurality of plate members 61 arranged on the inner peripheral surface of the cylindrical member 60a. The plate members 61 are arranged in parallel in the longitudinal direction of the cylindrical member 60a at predetermined intervals in a state in which the in-plane direction of each of the plate member 61 is arranged along a direction substantially perpendicular to the longitudinal direction of the cylindrical member 60a. Therefore, the plate members 61 are arranged with a gap therebetween. Further, an opening 63 is continuously formed in the respective plate members 61. The openings 63 are arranged on the same straight line. By arranging the plate members 61 including the openings 63 as described above, the cylindrical member 60a is provided with a labyrinth structure. The laser light passes through the continuous openings 63. In FIG. 3, for ease of viewing, the plate members 61 and the openings 63 are shown in a simplified manner, and only one plate member 61 and one opening 63 are denoted by reference numerals, and the reference numerals of the other plate members 61 and the other openings 63 are omitted. The cylindrical member 60b has the same configuration as the cylindrical member 60a.

Referring back to FIG. 2, the gas laser device 100 of the present example will be described. The charger 141 is a DC power source device that charges a capacitor (not shown) provided in the pulse power module 143 with a predetermined voltage. The charger 141 is arranged outside the housing 30 and is connected to the pulse power module 143. The pulse power module 143 includes a switch 143a controlled by the laser processor 190. When the switch 143a is turned ON from OFF by the control, the pulse power module 143 boosts the voltage applied from the charger 141 to generate a pulse high voltage, and applies the high voltage to the electrodes 32a, 32b. When the high voltage is applied, the insulation between the electrode 32a and the electrode 32b is broken, and discharge occurs. The laser medium in the housing 30 is excited by the energy of the discharge, and an excimer of an excited level is generated. Then, when the excimer shifts to a ground level in which the excimer dissociates into two atoms, light corresponding to the difference between the energy levels is emitted. The emitted light travels to the windows 31a, 31b.

The rear mirror 145 faces the window 31b, and the output coupling mirror 147 faces the window 31a. The rear mirror 145 is coated with a high reflection film, and the output coupling mirror 147 is coated with a partial reflection film. The rear mirror 145 reflects the laser light output from the window 31b at a high reflectance and returns the laser light to the housing 30. The output coupling mirror 147 transmits a part of the laser light output from the window 31a, and reflects another part of the laser light to return to the internal space of the housing 30 through the window 31a. The output coupling mirror 147 includes, for example, an element in which a dielectric multilayer film is formed on a substrate of calcium fluoride.

Therefore, the rear mirror 145 and the output coupling mirror 147 configure a Fabry-Perot laser resonator, and the housing 30 is arranged on the optical path of the laser resonator. Therefore, the laser light output from the housing reciprocates between the rear mirror 145 and the output coupling mirror 147. The reciprocating laser light is amplified every time the laser light passes through a laser gain space between the electrode 32a and the electrode 32b. Part of the amplified light is transmitted through the output coupling mirror 147 as pulse laser light.

The rear mirror 145 is fixed at the internal space of the housing 145a connected to the rear side of the housing 30. Further, the output coupling mirror 147 is fixed at the internal space of an optical path pipe 147a connected to the front side of the housing 30.

Here, the window 31b may have the function of the rear mirror 145. In this case, the holder 31d can have a flexible structure so that the angle of the laser light incident on the window 31b can be adjusted. Further, the window 31a may have the function of the output coupling mirror 147. In this case, the holder 31c can have a flexible structure so that the angle of the laser light incident on the window 31b can be adjusted. Instead of the rear mirror 145, a line narrowing module (not shown) that narrows the laser light may be arranged. The line narrowing module includes a prism, a grating, and a rotation stage. The prism, the grating, and the rotation stage are arranged at the internal space of the housing 145a.

The prism expands the beam width of the light output from the window 31b and causes the light to be incident on the grating. The prism also reduces the beam width of the light reflected from the grating and returns the light to the internal space of the housing 30 through the window 31b. At least one prism may be arranged.

The surface of the grating is configured of a material having a high reflectance, and a large number of grooves are provided on the surface at predetermined intervals. The grating is a dispersive optical element. The cross sectional shape of each groove is, for example, a right triangle. The light incident on the grating from the prism is reflected by these grooves and diffracted in a direction corresponding to the wavelength of the light. The grating is arranged in the Littrow arrangement, which causes the incident angle of the light incident on the grating from the prism to coincide with the diffraction angle of the diffracted light having a desired wavelength. Thus, light having a wavelength close to the desired wavelength returns to the housing 30 via the prism.

The rotation stage supports the prism and rotates the prism. By rotating the prism, the incident angle of the light with respect to the grating is changed. Therefore, by rotating the prism, the wavelength of the light returning from the grating to the housing 30 via the prism can be selected.

The output coupling mirror 147 and the grating provided with the housing 30 interposed therebetween configure the laser resonator, and the housing 30 is arranged on the optical path of the laser resonator. Therefore, the light output from the housing 30 reciprocates between the grating and the output coupling mirror 147.

The monitor module 150 is arranged on the optical path of the pulse laser light transmitted through the output coupling mirror 147. The monitor module 150 includes a housing 151, a beam splitter 152 arranged at the internal space of the housing 151, a light concentrating lens 153, and an optical sensor 154 as a main configuration. An opening is continuously formed in the housing 151, and the optical path pipe 147a is connected to surround the opening. Therefore, the internal space of the housing 151 communicates with the internal space of the optical path pipe 147a through the opening.

The beam splitter 152 transmits the pulse laser light transmitted through the output coupling mirror 147 to an output window 161 with a high transmittance, and reflects part of the pulse laser light toward the light concentrating lens 153. The light concentrating lens 153 concentrates the pulse laser light on the light receiving surface of the optical sensor 154. The optical sensor 154 measures a pulse energy E of the pulse laser light incident on the light receiving surface. The optical sensor 154 is electrically connected to the laser processor 190, and outputs a signal indicating data related to the measured pulse energy E to the laser processor 190.

An opening is continuously formed in the housing 151 of the monitor module 150 on the side opposite to the side to which the optical path pipe 147a is connected, and an optical path pipe 161a is connected to surround the opening. Thus, the internal space of the housing 151 and the internal space of the optical path pipe 161a communicate with each other. Further, the optical path pipe 161a is connected to the housing 110. The output window 161 is provided at a position surrounded by the optical path pipe 161a in the housing 110. Light transmitted through the beam splitter 152 of the monitor module 150 is output from the output window 161 to the exposure apparatus 200 outside the housing 110.

The optical path pipes 147a, 161a and the internal space of the housings 145a, 151 are filled with a purge gas. The purge gas includes an inert gas such as high-purity nitrogen containing an amount of impurities such as oxygen. The purge gas is supplied from a purge gas supply source (not shown) arranged outside the housing 110 to the optical path pipes 147a, 161a and the internal space of the housings 145a, 151 through a pipe (not shown).

The pressure sensor 48 measures the pressure at the internal space of the housing 30. The pressure sensor 48 is electrically connected to the laser processor 190 and outputs a signal indicating data related to the measured pressure to the laser processor 190.

The laser gas supply device is supplied with the laser gas from a laser gas supply source (not shown) arranged outside the housing 110 through a pipe (not shown). The laser gas supply device is provided with a valve (not shown) and a flow rate adjustment valve (not shown), and is connected to another pipe connected to the housing 30. In accordance with a control signal from the laser processor 190, the laser gas supply device supplies a plurality of types of gases to the internal space of the housing 30 through the other pipe. A pipe connected to the housing 30 is connected to the laser gas exhaust device. The laser gas exhaust device includes an exhaust pump (not shown), and exhausts the gas at the internal space of the housing 30 to the internal space of the housing 110 through the pipe by the exhaust pump.

Further, the housing 110 is provided with an exhaust duct 111. The gas is exhausted from the exhaust duct 111 to the outside of the housing 110. The gas includes a gas exhausted from the internal space of the housing 30 to the internal space of the housing 110 by the laser gas exhaust device, and a gas exhausted from the inside of the optical path pipes 147a, 161a and the like to the internal space of the housing 110 by an unillustrated configuration.

The laser processor 190 of the present disclosure is a processing device including a storage device in which a control program is stored and a CPU which executes the control program. The laser processor 190 is specifically configured or programmed to perform various processes included in the present disclosure. The laser processor 190 controls the entire gas laser device 100. The laser processor 190 is electrically connected to an exposure processor of the exposure apparatus 200, and transmits and receives various signals to and from the exposure processor.

2.2 Operation

Next, operation of the gas laser device 100 of the comparative example will be described.

Before the gas laser device 100 outputs the pulse laser light, the internal space of the optical path pipes 147a, 161a and the internal space of the housings 145a, 151 are filled with the purge gas from the purge gas supply source (not shown). Further, the laser gas is supplied from the laser gas supply device (not shown) to the internal space of the housing 30. When the laser gas is supplied, the laser processor 190 controls the motor 46a to rotate the cross flow fan 46. By the rotation of the cross flow fan 46, the laser gas circulates through the internal space of the housing 30.

When the gas laser device 100 outputs the pulse laser light, the laser processor 190 sets the predetermined charge voltage to the charger 141 and turns on the switch 143a. Thus, the pulse power module 143 generates a pulse high voltage from the electric energy held in the charger 141, and applies the high voltage between the electrode 32a and the electrode 32b. When the high voltage is applied, the insulation between the electrode 32a and the electrode 32b is broken, and discharge occurs. When discharge occurs, the laser medium contained in the laser gas between the electrode 32a and the electrode 32b is brought into an excited state by the energy of the discharge, and emits spontaneous emission light when returning into the ground state. Part of this light is ultraviolet light, and the light transmitted through the window 31b is reflected by the rear mirror 145. The light reflected by the rear mirror 145 propagates again from the window 31b to the internal space of the housing 30. The light propagating to the internal space of the housing 30 causes stimulated emission of the laser medium in the excited state, and the light is amplified. The light is transmitted through the window 31a and travels to the output coupling mirror 147. Part of the light is transmitted through the output coupling mirror 147, and the remaining part of the light is reflected by the output coupling mirror 147, is transmitted through the window 31a, and propagates to the internal space of the housing 30. The light propagating to the internal space of the housing 30 travels to the rear mirror 145 as described above. Thus, the laser light reciprocates between the rear mirror 145 and the output coupling mirror 147, and is amplified every time it passes through the discharge space at the internal space of the housing 30.

Then, part of the laser light is transmitted through the output coupling mirror 147 as pulse laser light and travels to the beam splitter 152.

Part of the pulse laser light having traveled to the beam splitter 152 is reflected by the beam splitter 152. The reflected pulse laser light is received by the optical sensor 154, and the optical sensor 154 measures the pulse energy E of the received pulse laser light. The optical sensor 154 outputs the signal indicating the data related to the measured pulse energy E to the laser processor 190. The laser processor 190 performs feedback control on the charge voltage of the charger 141 so that a difference $\Delta E$ between the pulse energy E and the target pulse energy Et is within an allowable range. When the difference $\Delta E$ is within the allowable range, the pulse laser light is transmitted through the beam splitter 152 and the output window 161 and enters the exposure apparatus 200. The pulse laser light is ArF laser light, which is an ultraviolet ray having a center wavelength of about 193 nm.

Here, the pressure at the internal space of the housing is measured by the pressure sensor 48, and the signal indicating the data related to the pressure is input from the pressure sensor 48 to the laser processor 190. When the charge voltage is more than a maximum value of an allowable range, the laser processor 190 controls the laser gas supply device based on the signal from the pressure sensor 48, and supplies the laser gas to the internal space of the housing until the pressure at the internal space of the housing becomes a predetermined pressure. When the charge voltage is less than a minimum value of the allowable range, the laser processor 190 controls the laser gas exhaust device based on the signal, and exhausts the laser gas from the internal space of the housing 30 until the pressure becomes a predetermined pressure.

Incidentally, when discharge occurs between the electrode 32a and the electrode 32b as described above, metallic powder and vapor are generated from the electrodes 32a, 32b due to sputtering or heat caused by the discharge. The metallic powder and the vapor react with the $F_2$ gas in the laser gas, and a fluoride is generated. Fluoride fine particles circulate through the internal space of the housing together with the laser gas by the cross flow fan 46. The circulation causes a pressure difference between the opening and the opening 30j or the opening 30k, and the pressure difference causes a part of the laser gas containing the fine particles to flow from the opening 30c and the inlet port 51 to the filter case 50. The flow of the laser gas from the internal space of the housing 30 to the filter case 50 is indicated by a dashed arrow in FIG. 4.

A part of the laser gas flowing to the filter case 50 flows to the filter 53a and is filtered, so that the fine particles are removed from the laser gas. The laser gas from which the fine particles have been removed flows through the flow path 30d and flows into the purge chamber 30g. A part of the flowing laser gas passes through the opening 30j and flows into the internal space of the housing 30. Further, another part of the laser gas is blown to the window 31a. Then, the other part of the laser gas is bounced back from the window 31a, passes through the opening 30j, and flows into the internal space of the housing 30. Incidentally, the fine particles floating at the internal space of the housing 30 may flow from the opening 30j to the window 31a through the purge chamber 30g. In order to suppress such fine particles from adhering to the window 31a, the cylindrical member 60a is arranged. The laser gas containing the fine particles flowing from the opening 30j is compressed when passing through the opening 63 at the cylindrical member 60a, and after passing through the gap between the adjacent plate members 61, the compression is released and the laser gas is expanded. The laser gas repeats compression and expansion as traveling through the internal space of the cylindrical member 60a in the longitudinal direction of the cylindrical member 60a, and a part of the fine particles contained in the laser gas adheres to the plate members 61 and the inner peripheral surface of the cylindrical member 60a and is removed. The laser gas from which the fine particles have been removed flows to the window 31a and is blown to the window 31a. Therefore, adhesion of the fine particles, on the window 31a, flowing from the opening 30j is suppressed. In the above, description has been provided on the flow and blowing of the laser gas using the front side, but the same applies to the flow and blowing of the laser gas on the rear side. Therefore, by blowing the laser gas to the window 31b, adhesion of the fine particles to the window 31b is suppressed.

2.3 Problem

In the chamber device CH of the comparative example, there is a concern that the flow rate of the laser gas flowing to the filter case 50 may be insufficient only with the flow of the laser gas due to the pressure difference caused by the driving of the cross flow fan 46. In this case, the flow rate of the laser gas flowing from the purge chambers 30g, 30g to the internal space of the housing 30 through the openings 30j, 30k is reduced respectively, and the fine particles may travel from the internal space of the housing 30 to the windows 31a, 31b through the openings 30j, 30k, respectively. Since only a part of the fine particles in the laser gas can be removed by the cylindrical members 60b, the fine particles may adhere to the windows 31a, 31b, and transmittances of the windows 31a, 31b may decrease due to the fine particles. When the transmittances decrease, the energy density of the pulse laser light output from the gas laser device 100 toward the exposure apparatus 200 may decrease. Therefore, the reliability of the gas laser device 100 may be decreased. When the pulse energy of the gas laser device increases, the amount of the fine particles generated due to an increase in the electrode area and the like increases, and thus the insufficient flow rate becomes more significant.

Therefore, embodiments in the following exemplify the chamber device CH in which a decrease in reliability of the gas laser device 100 can be suppressed.

3. Description of Chamber Device of First Embodiment

Next, the chamber device CH of a first embodiment will be described. Any component same as that described above is denoted by an identical reference sign, and duplicate description thereof is omitted unless specific description is needed. Further, in some drawings, a part of a member may be omitted or simplified for ease of viewing.

3.1 Configuration

Figure 5:
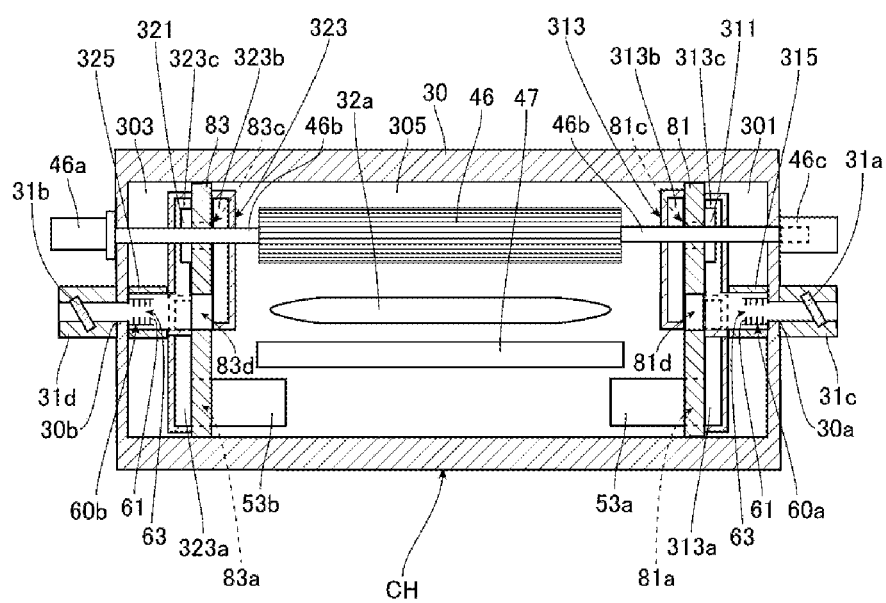
FIG. 5 is a view showing the internal space of the housing of the chamber device of a first embodiment viewed from the insulating portion side toward the cross flow fan side.

FIG. 5 is a view showing the internal space of the housing 30 of the chamber device CH of the present embodiment viewed from the insulating portion 33 side toward the cross flow fan 46 side. In the chamber device CH of the present embodiment, unlike the chamber device CH of the comparative example, the filter case 50, the flow paths 30d, 30e, and the purge chambers 30g, 30h are not provided.

The chamber device CH includes partition walls 81, 83 provided at the internal space of the housing 30. The partition wall 81 is provided between the front-side wall surface and the electrodes 32a, 32b, and the partition wall 83 is provided between the rear-side wall surface and the electrodes 32a, 32b. Further, the main surface of the partition wall 81 faces the front-side wall surface of the housing 30, and the main surface of the partition wall 83 faces the rear-side wall surface of the housing 30. The partition walls 81, 83 partition the internal space of the housing 30 into three internal spaces 301, 303, 305. The internal space 301 is a space on the front window side between the partition wall 81 and the front-side wall surface of the housing 30, and the internal space 303 is a space on the rear window side between the partition wall 83 and the rear-side wall surface of the housing 30. The internal space 301 is in contact with the front-side wall surface, and the internal space 303 is in contact with the rear-side wall surface. The internal space 305 is a space between the internal space 301 and the internal space 303, specifically, a space on the side of the electrodes 32a, 32b between the partition wall 81 and the partition wall 83. The internal space 305 is on the side opposite to the internal space 301 with respect to the partition wall 81, and is on the side opposite to the internal space 303 with respect to the partition wall 83. The internal space 301 and the internal space 303 have the same size, and the internal space 305 is wider than the internal spaces 301, 305.

The electrodes 32a, 32b, the electrode holder portion 36, the cross flow fan 46 that is a first fan, the heat exchanger 47, and the pressure sensor 48 are arranged at the internal space 305. In FIG. 5, for clarity of illustration, the electrode 32b, the electrode holder portion 36, and the pressure sensor 48 are not shown.

In the chamber device CH of the present embodiment, the cross flow fan 46 and the heat exchanger 47 are arranged at the internal space 305 in a manner opposite to the comparative example. Further, unlike the internal space of the housing 30 of the comparative example, filters 53a, 53b are arranged at the internal space 305. The filters 53a, 53b are arranged on the side opposite to the cross flow fan 46 with respect to the heat exchanger 47. In the chamber device CH of the present embodiment, the laser gas circulates, by the cross flow fan 46, through the cross flow fan 46, the space between the electrode 32a and the electrode 32b, the filters 53a, 53b, the heat exchanger 47, and the cross flow fan 46 in this order. Therefore, the filters 53a, 53b filter the laser gas flowing by the cross flow fan 46 and passing therethrough to remove the fine particles from the laser gas. The filter 53a is arranged adjacent to the partition wall 81 at the internal space 305 to block an opening 81a continuously formed with the partition wall 81, and the filter 53b is arranged adjacent to the partition wall 83 at the internal space 305 to block an opening 83a continuously formed with the partition wall 83. In FIG. 5, the openings 81a, 83a are indicated by broken lines. The filters 53a, 53b and the openings 81a, 83a are arranged on the same straight line in the travel direction of the laser light. Each of the filters 53a, 53b is shorter than those of the comparative example. Here, each of the filters 53a, 53b may be longer than or may have the same length as those of the comparative example. Alternatively, one filter may be positioned between the openings 81a, 83a to block the openings 81a, 83a.

The chamber device CH of the present embodiment includes a second fan, a fan-side flow path at which the second fan is arranged, and a window-side flow path that communicates with the fan-side flow path and allows the laser gas to flow to the window side, each of which being arranged separately on the front side and the rear side. Hereinafter, the second fan, the fan-side flow path, and the window-side flow path on the front side will be described as a second fan 311, a flow path 313, and a flow path 315. The second fan, the fan-side flow path, and the window-side flow path on the rear side will be described as a second fan 321, a flow path 323, and a flow path 325. In the following, description will be provided on the second fan 311, the flow path 313, and the flow path 315 on the front side, but the second fan 321, the flow path 323, and the flow path 325 on the rear side have the same configuration as the second fan 311, the flow path 313, and the flow path 315 on the front side. Therefore, the second fan 321, the flow path 323, and the flow path 325 can obtain similar operation and effects as the second fan 311, the flow path 313, and the flow path 315.

Figure 6:
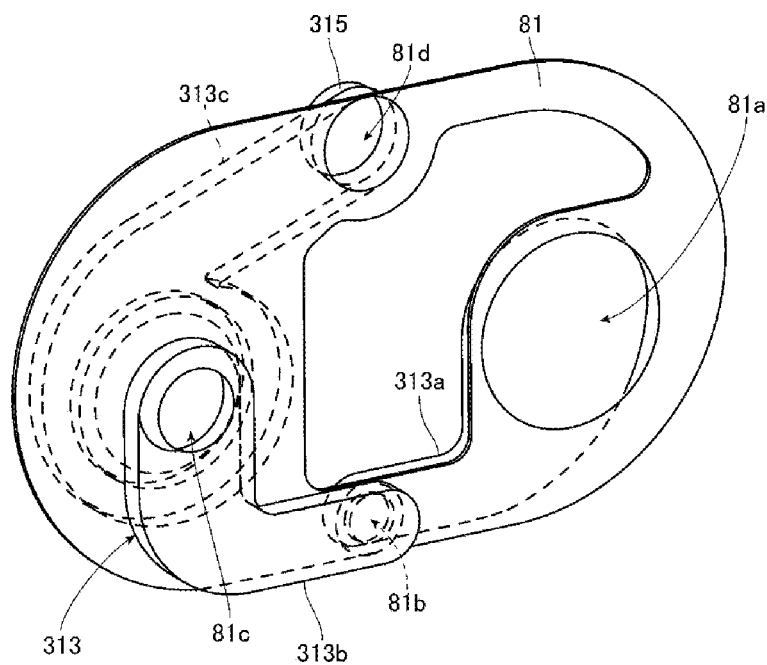
FIG. 6 is a perspective view of a partition wall and a front-side flow path viewed from the internal space at which electrodes are arranged.
Figure 7:
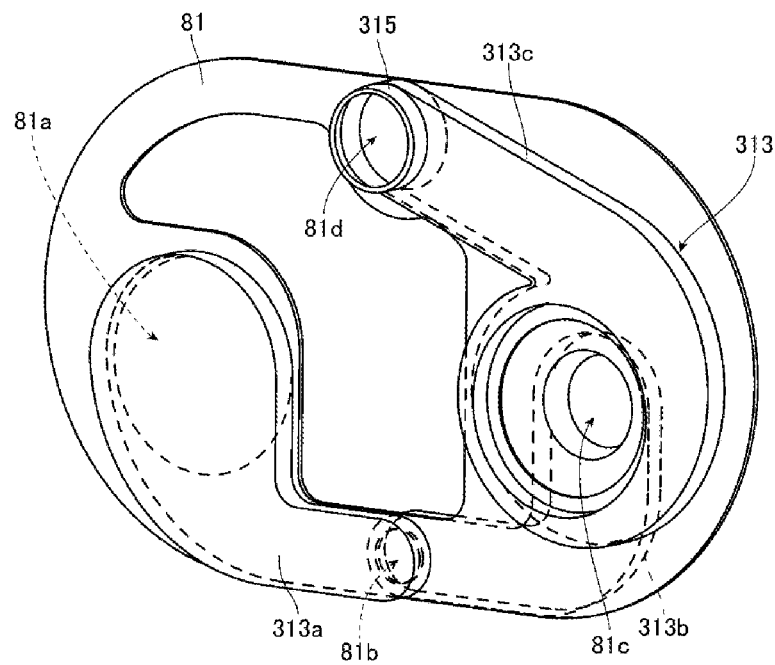
FIG. 7 is a perspective view of the partition wall and the front-side flow path viewed from the internal space on a window side.

FIG. 6 is a perspective view of the partition wall 81 and the flow path 313 viewed from the internal space 305, and FIG. 7 is a perspective view of the partition wall 81 and the flow path 313 viewed from the internal space 301.

The second fan 311 is arranged at the flow path 313, and the laser gas filtered by the filter 53a flows through the flow path 313 by the second fan 311. The flow path 313 of the present embodiment is provided at the internal space 301 and the internal space 305 through the openings 81a, 81b, 81c of the partition wall 81. The flow path 313 as described above includes a first flow path 313a provided at the internal space 301, a second flow path 313b provided at the internal space 305, and a third flow path 313c provided at the internal space 301. Each of the first flow path 313a, the second flow path 313b, and the third flow path 313c is a space surrounded by the partition wall 81 and a plate member. The first flow path 313a, the second flow path 313b, and the third flow path 313c are provided along the plane direction of the partition wall 81.

One end of the first flow path 313a communicates with the internal space 305 through the opening 81a and the filter 53a, and the laser gas at the internal space 305 flows into the first flow path 313a through the opening 81a, which is a first opening, from the internal space 305. The other end of the first flow path 313a communicates with the opening 81b continuously formed with the partition wall 81. The opening 81b is smaller than the opening 81a and is located below the opening 81a. In FIG. 5, a part of the first flow path 313a hidden by the third flow path 313c is indicated by broken lines, and in FIG. 6, a part of the first flow path 313a hidden by the partition wall 81 is indicated by broken lines. Further, in FIG. 5, the opening 81b is omitted for easy viewing, and in FIGS. 6 and 7, the opening 81b is indicated by broken lines.

One end of the second flow path 313b communicates with the first flow path 313a through the opening 81b, which is a second opening, and the laser gas at the first flow path 313a flows into the second flow path 313b through the opening 81b which is the second opening from the first flow path 313a. The other end of the second flow path 313b communicates with the opening 81c, which is a third opening, continuously formed with the partition wall 81. In FIG. 7, a part of the second flow path 313b hidden by the partition wall 81 is indicated by broken lines. The opening 81c is larger than the opening 81b and smaller than the opening 81a. The opening 81c is located substantially at the same height as the opening 81a on the side opposite to the opening 81a with respect to the opening 81b. In FIG. 5, the opening 81c is indicated by broken lines.

One end of the third flow path 313c communicates with the second flow path 313b through the opening 81c, and the laser gas at the second flow path 313b flows into the third flow path 313c through the opening 81c, which is the third opening, from the second flow path 313b. The other end of the third flow path 313c communicates with the internal space 305 through the opening 81d and with one end of the flow path 315 at the partition wall 83 side. The third flow path 313c as described above causes a part of the laser gas to flow into the internal space 305 through the opening 81d and another part of the laser gas to flow through the flow path 315. Therefore, the third flow path 313c causes a part of the laser gas to flow away from the window 31a and another part of the laser gas to flow toward the window 31a. The opening 81d is larger than the opening 81c and smaller than the opening 81a. The opening 81d is located above the opening 81b.

The second fan 311 is, for example, a centrifugal fan, and is arranged adjacent to the opening 81c at the third flow path 313c. The arrangement position of the second fan 311 is a substantially middle position of the flow path 313. Incidentally, a drive shaft 46b of the cross flow fan 46 is inserted through the second flow path 313b, the opening 81c, and the third flow path 313c, and the distal end of the drive shaft 46b is held by a bearing 46c arranged outside the housing 30. The drive shaft 46b is connected to the second fan 311, and the second fan 311 is rotated by the rotation of the drive shaft 46b. Accordingly, when the drive shaft 46b and the cross flow fan 46 are rotated by the drive force of the motor 46a, which is the power source of the cross flow fan 46, the second fan 311 rotates in the same direction together with the cross flow fan 46 by the drive force. The second fan 311 causes the laser gas in the flow path 313 to flow through the flow path 315 by the rotation.

The flow path 315 is an internal space of a cylindrical member, and is provided at the internal space 301. The longitudinal direction of the flow path 315 is along the travel direction of the laser light. The flow path 315 is provided at the internal space 301. One end of the flow path 315 communicates with the third flow path 313c, and the other end of the flow path 315 is connected to the front-side wall surface of the housing 30 to surround the opening 30a. When viewed along the travel direction of the pulse laser light, the opening 81d, a communication portion between the opening 81d and the third flow path 313c, a communication portion between the third flow path 313c and the flow path 315, and the flow path 315 overlap the window 31a. The flow path 315 causes the laser gas flowing, by the second fan 311, from the third flow path 313c of the flow path 315 to flow toward the window 31a. Further, the flow path 315 causes the laser gas bounced back from the window 31a to flow away from the window 31a, specifically, causes the laser gas to flow into the internal space 305 through the opening 81d.

The cylindrical member 60a is arranged at the flow path 315. The cylindrical member 60a is arranged coaxially with the window 31a. The cylindrical member 60a is shorter than the flow path 315. One end of the cylindrical member 60a is located away from the partition wall 81 and is located closer to the window 31a than the third flow path 313c. The other end of the cylindrical member 60a is connected to the front-side wall surface of the housing 30 to surround the opening 30a.

In FIG. 5, the respective flow paths of the flow path 323 corresponding to the first flow path 313a, the second flow path 313b, and the third flow path 313c are shown as a first flow path 323a, a second flow path 323b, and a third flow path 323c. Further, openings corresponding to the openings 81a, 81b, 81c, 81d are shown as openings 83a, 83b, 83c, 83d, respectively.

3.2 Operation

Next, operation of the cross flow fan 46 and the second fan 311 in the present embodiment will be described.

When the motor 46a rotates, the drive shaft 46b connected to the motor 46a and the cross flow fan 46 rotates. Thus, the cross flow fan 46 rotates by the drive force of the motor 46a. Further, since the second fan 311 is connected to the drive shaft 46b, the second fan 311 rotates in the same direction at the same time as the rotation of the cross flow fan 46 by the drive force of the motor 46a. Thus, most of the laser gas circulates through the cross flow fan 46, the space between the electrode 32a and the electrode 32b, the filters 53a, 53b, the heat exchanger 47, and the cross flow fan 46 in this order by the rotation of the cross flow fan 46. Further, another part of the laser gas passes through the filter 53a and the opening 81a and flows to the flow path 313 by the rotation of the cross flow fan 46 and the second fan 311. The laser gas is filtered by the filter 53a, and flows to the flow path 313 in a state in which the fine particles contained in the laser gas are removed from the laser gas by the filtering.

At the flow path 313, the laser gas flows, by the second fan 311, through the first flow path 313a, the opening 81b, the second flow path 313b, the opening 81c, and the third flow path 313c in this order. At the other end side of the third flow path 313c, the travel direction of the laser gas is substantially perpendicular to the axial direction of the opening 81d and the flow path 315. The axial direction is the travel direction of the laser light. Further, at the other end of the third flow path 313c, the laser gas collides with the inner peripheral surface of the third flow path 313c located on the travel direction of the laser gas. Due to the collision, a part of the laser gas passes through the opening 81d and flows into the internal space 305, and another part of the laser gas flows to the flow path 315.

In the flow path 315, the laser gas flows to the cylindrical member 60a, flows to the window 31a, and is blown to the window 31a. The laser gas having blown to the window 31a is bounced back from the window 31a, passes through the cylindrical member 60a, the flow path 315, and the opening 81d, and flows into the internal space 305.

3.3 Effect

In the chamber device CH of the present embodiment, the second fan 311 rotates together with the cross flow fan 46 by the drive force of the motor 46a, which is the drive force of the cross flow fan 46. The laser gas filtered by the filter 53a flows through the flow path 313, which is the fan-side flow path, by the second fan 311. A part of the laser gas flows away from the window 31a, and the other part flows to the flow path 315, which is the window-side flow path. The laser gas having flown to the flow path 315 flows toward the window 31a, is bounced back from the window 31a, and flows away from the window 31a through the flow path 315.

In the chamber device CH of the present embodiment, the flow rate of the laser gas at the flow path 313 is increased by the second fan 311. Therefore, even if the laser gas containing the fine particles at the internal space 305 on the side of the electrodes 32a, 32b attempts to travel toward the window 31a, the laser gas is pushed back to the internal space 305 by the laser gas flowing away from the window 31a with the flow rate increased as described above. Thus, traveling of the fine particles from the internal space 305 to the window 31a can be suppressed, and adhesion of the fine particles to the window 31a can be suppressed. Further, since the laser gas flowing to the window 31a is blown to the window 31a with the fine particles removed, adhesion of the fine particles by the blowing can be suppressed. When adhesion is suppressed as described above, a decrease in the transmittance of the window 31a due to adhesion can be suppressed. When the decrease in the transmittance is suppressed, a decrease in the energy density of the pulse laser light output from the gas laser device 100 toward the exposure apparatus 200 can be suppressed, and a decrease in the reliability of the gas laser device 100 can be suppressed.

Further, the second fan 311 rotates together with the cross flow fan 46. Accordingly, the cross flow fan 46 and the second fan 311 may be driven commonly by the motor 46a. Thus, compared with a case in which the motor 46a is arranged for each of the cross flow fan 46 and the second fan 311, the number of the motor 46a can be reduced, the cost of the chamber device CH can be suppressed, and the chamber device CH can be reduced in size.

Further, in the chamber device CH of the present embodiment, the flow path 313 is provided at the internal space 301 and the internal space 305 wider than the internal space 301, and the flow path 315 is provided at the internal space 301. Since the internal space 305 is wider than the internal space 301, an extra space is easily secured at the internal space 305 as compared with the internal space 301. Therefore, in the above configuration, a part of the flow path 313 may be easily arranged at the internal space 301. Further, since another part of the flow path 313 is arranged at the internal space 305, a space in which each of the flow paths is arranged at the internal space 301 may be wider than in a case in which the flow path 313 and the flow path 315 are entirely arranged at the internal space 301. Thus, the part of the flow path 313 and the flow path 315 can be easily arranged at the internal space 301. Further, since the part of the flow path 313 is arranged at the internal space 305, the internal space 301 may be reduced in size, and the housing 30 may be reduced in length in the longitudinal direction.

Further, in the chamber device CH of the present embodiment, the third flow path 313c further causes the laser gas to flow into the internal space 305 communicating with the third flow path 313c through the opening 81d provided on the side opposite to the flow path 315 with respect to the third flow path 313c. The fine particles at the internal space 305 may travel, by the cross flow fan 46, from the internal space 305 to the window 31a through the opening 81d, the third flow path 313c, and the flow path 315. In the above configuration, a part of the laser gas flowing through the third flow path 313c flows into the internal space 305 so as to push back the fine particles. Therefore the inflow of the fine particles from the internal space 305 to the window 31a can be suppressed.

Further, in the chamber device CH of the present embodiment, when viewed along the travel direction of the pulse laser light, the opening 81d, the communication portion between the opening 81d and the third flow path 313c, the communication portion between the third flow path 313c and the flow path 315, and the flow path 315 overlap the window 31a. In this case, since the pulse laser light travels from the internal space 305 to the window 31a through the opening 81d, the third flow path 313c, and the flow path 315, it is unnecessary to provide an opening through which the pulse laser light passes in the partition wall 81 separately from the opening 81d.

Further, in the chamber device CH of the present embodiment, the third flow path 313c communicates with the flow path 315 on the partition wall 81 side with respect to the front-side wall surface side of the housing 30. In this case, as compared with a case in which the third flow path 313c communicates with the flow path 315 on the front-side wall surface side of the housing 30, the inflow of the fine particles from the internal space 305 to the flow path 315 through the opening 81d can be suppressed.

In the chamber device CH of the present embodiment, the filter 53a covers the opening 81a at the internal space 305. With this configuration, traveling of the fine particles to the flow path 313 can be suppressed as compared with a case in which the filter 53a is arranged at the internal space 305 without covering the opening 81a. When traveling of the fine particles to the flow path 313 is suppressed, accumulation of the fine particles in the flow paths 313, 315 and the traveling of the fine particles to the window 31a through the flow paths 313, 315 can be suppressed.

In the chamber device CH of the present embodiment, the cylindrical member 60a is arranged at the flow path 315. The cylindrical member 60a includes a plurality of the plate members 61 continuously formed with the openings 63, and the plate members 61 are arranged respectively in parallel in the longitudinal direction of the cylindrical member 60a at intervals. Thus, the laser gas repeats compression and expansion as traveling through the internal space of the cylindrical member 60a, so that the fine particles contained in the laser gas may adhere to the plate members 61 and the fine particles may be further removed from the laser gas.

Further, in the chamber device CH of the present embodiment, the second fan 311 is connected to the drive shaft 46b of the cross flow fan 46 and rotates by the rotation of the drive shaft 46b. With this configuration, the second fan 311 may rotate simultaneously with the cross flow fan 46. Further, in this configuration, compared with a case in which the drive shaft 46b is arranged individually for each of the cross flow fan 46 and the second fan 311, the number of the drive shafts 46b can be reduced, the cost of the chamber device CH can be suppressed, and the chamber device CH can be reduced in size.

In the chamber device CH of the present embodiment, the cross flow fan 46 has been described as the first fan, but the first fan may be a reflux fan. Further, although the second fan 311 has been described as the centrifugal fan, the second fan 311 may be a sirocco fan.

4. Description of Chamber Device of Second Embodiment

Next, the chamber device CH of a second embodiment will be described. Any component same as that described above is denoted by an identical reference sign, and duplicate description thereof is omitted unless specific description is needed.

4.1 Configuration

Figure 8:
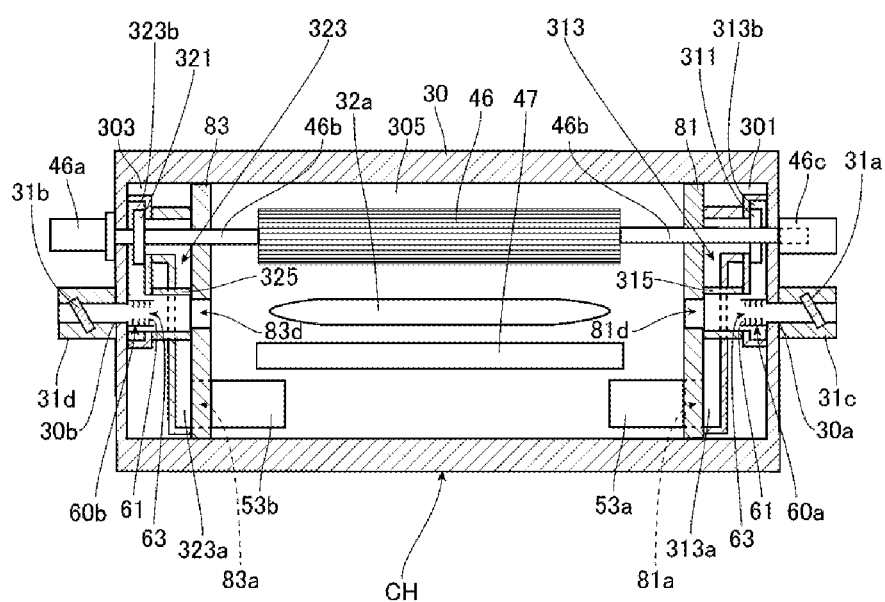
FIG. 8 is a view showing the internal space of the housing of the chamber device of a second embodiment viewed from the insulating portion side toward the cross flow fan side.

FIG. 8 is a view showing the internal space of the housing 30 of the present embodiment viewed from the insulating portion 33 side toward the cross flow fan 46 side. In the chamber device CH of the present embodiment, the configurations of the flow paths 313, 315, 323, 325 are different from the configurations of those of the first embodiment. Description will be provided using the flow paths 313, 315 in the following, but the flow paths 323, 325 has the same configuration as the flow paths 313, 315. Therefore, the flow paths 323, 325 can obtain similar operation and effects as the flow paths 313, 315.

The flow path 313 of the present embodiment includes the first flow path 313a and the second flow path 313b, and the first flow path 313a and the second flow path 313b being the entire flow path 313 is provided at the internal space 301. Therefore, the partition wall 81 of the present embodiment is not provided with the openings 81b, 81c, described in the first embodiment, which cause the flow paths of the flow path 313 to communicate with each other.

The second flow path 313b is a space surrounded by the front-side wall surface of the housing 30 and the plate member, and is provided along the wall surface. One end of the second flow path 313b communicates with the other end of the first flow path 313a, and the other end of the second flow path 313b communicates with the opening 30a. The second fan 311 is arranged on one end side of the second flow path 313b, and the cylindrical member 60a is arranged on the other end side of the second flow path 313b.

The flow path 315 is arranged on the side opposite to the front-side wall surface of the housing 30 with respect to the cylindrical member 60a. One end of the flow path 315 communicates with the other end of the second flow path 313b on the lateral side of the travel direction of the laser gas flowing through the second flow path 313b. The laser gas at the second flow path 313b flows into the flow path 315 from the second flow path 313b along the outer peripheral surface of the cylindrical member 60a. The opening 81d of the present embodiment is provided on the side opposite to the second flow path 313b with respect to the flow path 315, the diameter of the flow path 315 is larger than that of the opening 81d, and the other end of the flow path 315 is connected to the partition wall 81 to surround the opening 81d. When viewed along the travel direction of the pulse laser light, the opening 81d, a communication portion between the opening 81d and the flow path 315, the flow path 315, and the internal space of the cylindrical member 60a overlap the window 31a. The flow path 315 causes a part of the laser gas flowing from the second flow path 313b along the outer peripheral surface of the cylindrical member 60a as described above to flow toward the window 31a through the internal space of the cylindrical member 60a. Further, the flow path 315 causes another part of the laser gas to flow into the internal space 305 through the opening 81d. Further, the flow path 315 causes the laser gas bounced back from the window 31a and returning to the flow path 315 through the cylindrical member 60a to flow into the internal space 305 through the opening 81d. The flow path 313 as described above communicates with the second flow path 313b on the front-side wall surface side of the housing 30 with respect to the partition wall 81. Since the partition wall 81 of the present embodiment is not provided with the openings 81b, 81c, the opening 81d is the second opening of the partition wall 81.

In the flow path 313 of the present embodiment, the laser gas flows, by the second fan 311, through the first flow path 313a and the second flow path 313b in this order. At the other end of the second flow path 313b, the laser gas flows to the flow path 315 along the outer peripheral surface of the cylindrical member 60a in the travel direction of the pulse laser light. A part of the laser gas flowing to the flow path 315 passes through the opening 81d and flows into the internal space 305. Further, since the diameter of the flow path 315 is larger than that of the opening 81d as described above, another part of the laser gas collides with the wall surface of the partition wall 81 between the peripheral surface of the flow path 315 and the edge of the opening 81d. Due to the collision, the laser gas flows to the window 31a through the flow path 315 and the cylindrical member 60a. Therefore, the flow path 315 communicating with the second flow path 313b causes the laser gas to flow to the window 31a through the cylindrical member 60a provided in the second flow path 313b. Therefore, the second flow path 313b causes a part of the laser gas to flow away from the window 31a through the flow path 315 and the opening 81d, and causes another part of the laser gas to flow toward the window 31a through the flow path 315. The laser gas at the flow path 315 is blown to the window 31a. The laser gas blown to the window 31a is bounced back from the window 31a. The flow path 315 causes the laser gas bounced back from the window 31a to flow away from the window 31a, specifically, causes the laser gas to flow into the internal space 305 through the opening 81d.

4.2 Effect

In the chamber device CH of the present embodiment, the flow path 313 and the flow path 315 are arranged at the internal space 301. Therefore, it is unnecessary to provide the openings 81b, 81c in the partition wall 81. Further, since the flow path 313 and the flow path 315 are not arranged at the internal space 305, it is possible to suppress the flow of the gas by the cross flow fan 46 from being disturbed by the flow path 313 and the flow path 315.

The description above is intended to be illustrative and the present disclosure is not limited thereto. Therefore, it would be obvious to those skilled in the art that various modifications to the embodiment of the present disclosure would be possible without departing from the spirit and the scope of the appended claims. Further, it would be also obvious to those skilled in the art that the embodiment of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A chamber device comprising:
   a housing into which a laser gas is filled;
   a pair of discharge electrodes arranged to face each other at an internal space of the housing and configured to generate light from the laser gas when a voltage is applied thereto;
   a window arranged at a wall surface of the housing and configured to transmit the light therethrough;
   a first fan arranged at the internal space and configured to cause the laser gas to flow between the pair of discharge electrodes;
   a filter arranged at the internal space;
   a second fan configured to rotate together with the first fan by a drive force of a drive source of the first fan;
   a fan-side flow path arranged at the internal space and configured to cause the laser gas filtered by the filter to flow by the second fan and a part of the laser gas to flow in a direction away from the window; and
   a window-side flow path arranged at the internal space, communicating with the fan-side flow path, and configured to cause the laser gas flowing from the fan-side flow path by the second fan to flow toward the window.

2. The chamber device according to claim 1, further comprising a partition wall arranged between the wall surface at which the window is provided and the discharge electrodes, and partitioning the internal space into a window-side internal space being in contact with the wall surface at which the window is provided and an electrode-side internal space at which the discharge electrodes are located and which is wider than the window-side internal space,
   wherein the fan-side flow path is provided at the window-side internal space and the electrode-side internal space through the partition wall, and
   the window-side flow path is provided at the window-side internal space.

3. The chamber device according to claim 2,
   wherein the fan-side flow path includes:
   a first flow path which is provided at the window-side internal space and into which the laser gas at the electrode-side internal space flows through a first opening of the partition wall,
   a second flow path which is provided at the electrode-side internal space and into which the laser gas at the first flow path flows through a second opening of the partition wall, and
   a third flow path which is provided at the window-side internal space and into which the laser gas at the second flow path flows through a third opening of the partition wall.

4. The chamber device according to claim 3,
   wherein the second fan is arranged at the third flow path.

5. The chamber device according to claim 3,
   wherein the filter covers, at the electrode-side internal space, the first opening.

6. The chamber device according to claim 3, further comprising a cylindrical member arranged at the window-side flow path,
   wherein the cylindrical member includes a plurality of plate members arranged at an internal space of the cylindrical member and continuously formed with an opening, and
   the plate members are arranged in parallel in a travel direction of the light at intervals.

7. The chamber device according to claim 3,
   wherein the third flow path causes the laser gas to flow into the electrode-side internal space through a fourth opening of the partition wall.

8. The chamber device according to claim 7,
   wherein, when viewed along a travel direction of the light, the fourth opening, a communication portion between the fourth opening and the third flow path, a communication portion between the third flow path and the window-side flow path, and the window-side flow path overlap the window.

9. The chamber device according to claim 1, further comprising a partition wall provided between the wall surface at which the window is provided and the discharge electrodes,
   wherein the fan-side flow path and the window-side flow path are provided at a window-side internal space of the internal space between the partition wall and the wall surface at which the window is provided.

10. The chamber device according to claim 9,
    wherein the second fan is arranged at the fan-side flow path.

11. The chamber device according to claim 9,
    wherein the laser gas at an electrode-side internal space which is on a side opposite to the window-side internal space with respect to the partition wall and at which the discharge electrodes are located flows into the fan-side flow path through a first opening of the partition wall, and
    the filter covers, at the electrode-side internal space, the first opening.

12. The chamber device according to claim 9, further comprising a cylindrical member arranged at the fan-side flow path,
    wherein the cylindrical member includes a plurality of plate members arranged at an internal space of the cylindrical member and continuously formed with an opening, and the plate members are arranged in parallel in a travel direction of the light at intervals.

13. The chamber device according to claim 9, wherein the fan-side flow path causes the laser gas to flow into an electrode-side internal space which is on a side opposite to the window-side internal space with respect to the partition wall and at which the discharge electrodes are located through the window-side flow path and a second opening of the partition wall.

14. The chamber device according to claim 1, wherein the second fan is connected to a drive shaft of the first fan and rotates with rotation of the drive shaft.

15. The chamber device according to claim 1, wherein the second fan is a centrifugal fan.

16. The chamber device according to claim 1, wherein the second fan is a sirocco fan.

17. A gas laser device comprising a chamber device, the chamber device including:
a housing into which a laser gas is filled;
a pair of discharge electrodes arranged to face each other at an internal space of the housing and configured to generate light from the laser gas when a voltage is applied thereto;
a window arranged at a wall surface of the housing and configured to transmit the light therethrough;
a first fan arranged at the internal space and configured to cause the laser gas to flow between the pair of discharge electrodes;
a filter arranged at the internal space;
a second fan configured to rotate together with the first fan by a drive force of a drive source of the first fan;
a fan-side flow path arranged at the internal space and configured to cause the laser gas filtered by the filter to flow by the second fan and a part of the laser gas to flow in a direction away from the window; and
a window-side flow path arranged at the internal space, communicating with the fan-side flow path, and configured to cause the laser gas flowing from the fan-side flow path by the second fan to flow toward the window.

18. The gas laser device according to claim 17, wherein the gas laser device is an excimer laser device.

19. An electronic device manufacturing method, comprising:
generating laser light using a gas laser device including a chamber device;
outputting the laser light to an exposure apparatus; and
exposing a photosensitive substrate to the laser light in the exposure apparatus to manufacture an electronic device,
the chamber device including:
a housing into which a laser gas is filled;
a pair of discharge electrodes arranged to face each other at an internal space of the housing and configured to generate light from the laser gas when a voltage is applied thereto;
a window arranged at a wall surface of the housing and configured to transmit the light therethrough;
a first fan arranged at the internal space and configured to cause the laser gas to flow between the pair of discharge electrodes;
a filter arranged at the internal space;
a second fan configured to rotate together with the first fan by a drive force of a drive source of the first fan;
a fan-side flow path arranged at the internal space and configured to cause the laser gas filtered by the filter to flow by the second fan and a part of the laser gas to flow in a direction away from the window; and
a window-side flow path arranged at the internal space, communicating with the fan-side flow path, and configured to cause the laser gas flowing from the fan-side flow path by the second fan to flow toward the window.

20. The electronic device manufacturing method according to claim 19, wherein the gas laser device is an excimer laser device.

* * * * *